United States Patent [19]

Akiba et al.

[11] Patent Number: 4,663,737
[45] Date of Patent: May 5, 1987

[54] MAGNETIC BUBBLE MEMORY UNIT

[75] Inventors: Yutaka Akiba, Fujisawa; Kazuo Hirota, Yokohama, both of Japan

[73] Assignee: Hitachi, Ltd., Tokyo, Japan

[21] Appl. No.: 596,418

[22] Filed: Apr. 3, 1984

[30] Foreign Application Priority Data

Apr. 4, 1983 [JP] Japan .................................. 58-57812

[51] Int. Cl.[4] .............................................. G11C 19/08
[52] U.S. Cl. ........................................................ 365/2
[58] Field of Search ............................................ 365/2

[56] References Cited

U.S. PATENT DOCUMENTS 4,165,535 8/1979 Mortelmans et al. ................... 365/2

FOREIGN PATENT DOCUMENTS 0058188 5/1981 Japan ..................................... 365/2
0016435 5/1982 Japan ..................................... 365/2

OTHER PUBLICATIONS

IEEE Transactions on Magnetics–vol. Mag-13, No. 5, Sep. 1977, pp. 1376–1378.

Primary Examiner—James W. Moffitt
Attorney, Agent, or Firm—Antonelli, Terry & Wands

[57] ABSTRACT

In a magnetic bubble memory unit comprising two pairs of windings confronting in parallel each other, a printed circuit board having a magnetic bubble memory chip thereon surrounded by the windings for providing the rotating magnetic field, and a conductive shield case for covering the magnetic bubble memory chip on the printed circuit board, slitlike openings are provided on the side face of the conductive shield case so as to present connection between the printed circuit board and an external device.

20 Claims, 19 Drawing Figures

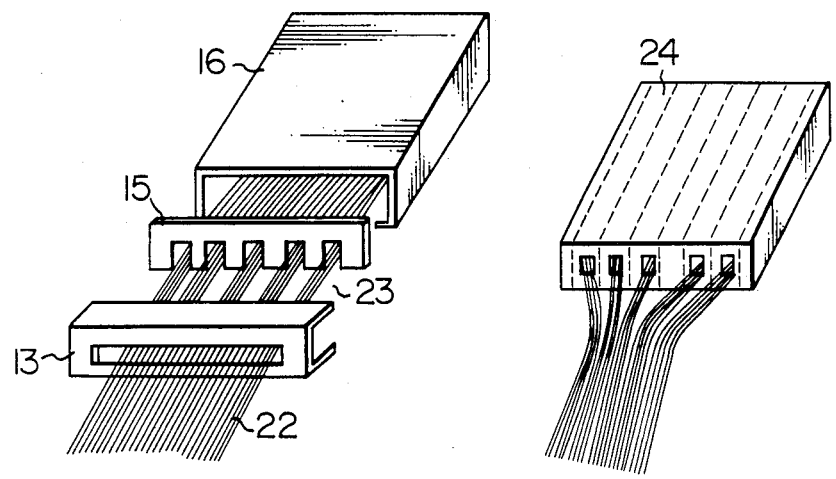

MAGNETIC BUBBLE MEMORY UNIT

BACKGROUND OF THE INVENTION

The present invention relates to a magnetic bubble memory unit, and in particular to a magnetic bubble memory unit in which the loss resistance caused by the eddy current in the conductive shield case has been reduced.

A magnetic bubble memory device is a small cylindrical magnetic domain appearing on a crystalline film such as rare-earth orthoferrite or magnetic garnet in which the internal magnetization exists perpendicular to the film surface due to strong magnetic anisotropy. The magnetic bubble memory device is controlled by the magnetic field or current fed from the outside and freely moves inside the film. Accordingly, the magnetic bubble can be used as a small-sized memory or a logic circuit.

The magnetic bubble memory device was announced by the Bell Telephone Laboratories in 1967. As compared with the magnetic tape or disk, the magnetic bubble device memory is faster in speed and higher in reliability because of absence of movable mechanical parts. As compared with the IC memory, the magnetic bubble memory is nonvolatile, higher in density, and simpler in manufacturing process. Owing to these advantages, the magnetic bubble memory is being developed as the auxiliary memory for the electronic exchange or the memory of a terminal device, a microcomputer or the like.

On the way to the invention, the inventors developed an intermediate magnetic bubble memory unit which has a structure as illustrated in FIG. 1. A chip 1 for a magnetic bubble memory is mounted on the central part of a printed circuit board 3. On the peripheral part of the board 3, a predetermined number of terminals 2 used for external connection are located. On the board 3, a magnetic core 5 made of a soft magnetic material, which takes the shape of a rectangular solid and has four windings 4 on parallel sides thereof confronting each other, is fixed so that the chip 1 will be positioned inside the magnetic core 5 and the terminals will be positioned outside the magnetic core 5. The core 5 may be omitted, though the magnetic field is weakend. The chip 1, the windings 4, the magnetic core 5, and the printed circuit board 3 excepting a part used for terminals 2 are covered by a conductive shield case 7. Only the part of the board 3 used for terminal 2 extends to the outside of the shield case 7 through an opening 6. Above and below the shield case 7, a set of a permanent magnetic plate and a magnetization alignment plate is located. The whole is covered by an annular magnetic shield case 8.

FIG. 2 is an exterior view of the above described conductive shield case 7. If only one large opening 6 for passing the external connection terminals 2 is provided as illustrated in FIG. 2, eddy currents 18 flow in the conductive shield case 7 as indicated by broken lines of FIG. 13b. Accordingly, the loss resistance R of the winding 4 illustrated in FIG. 1 is largely increased, preventing realization of a magnetic bubble memory unit having a low loss.

The rotating magnetic field for transferring the magnetic bubble in the magnetic bubble memory chip 1 is produced by letting flow orthogonal sine wave currents through two sets X and Y of windings 4. Each of the two sets X and Y is composed of two windings wound on confronting sides of the rectangular solid magnetic core 5. In this case, all the parts including the magnetic core 5 is covered by the conductive shield case 7 in order to keep an unwanted magnetic field from getting out, improve the distribution uniformity of the magnetic field, and enhance the intensity of the magnetic field. When the the eddy current 17 flows as illustrated in FIG. 13a, the conductive shield case serves to maintain the rotary field therein. However, when the eddy current flows through the portion near the opening 6 of the conductive shield case 7 as well, the eddy current distribution is not uniform and is biased as represented by the eddy current 18 of FIG. 13b. As a result, the effective loss resistance is increased. Especially, as the drive frequency f of the rotating magnetic field is increased, the effect due to the nonuniform eddy current is increased as represented by a curve b in FIG. 16 which illustrates the dependence of the loss resistance upon the frequency, resulting in a large increase in the loss resistance. In addition, when the distribution of the eddy current is not uniform in the conductive shield case, the uniformity of the magnetic field is deteriorated and the intensity of the magnetic field is lowered. The Japanese Patent Publication (Kokai) No. 16435/82 discloses a magnetic bubble module wherein a magnetic bubble chip on a circuit board is as a whole surrounded by two crossed windings.

SUMMARY OF THE INVENTION

Therefore, a first object of the present invention is to provide a structure of a magnetic bubble memory unit having a reduced loss resistance of the drive winding.

A second object of the present invention is to provide a structure of a conductive shield case whereby it is possible to maintain the uniform distribution of the eddy current flowing through the conductive shield case which is used to confine the rotating magnetic field for reducing the above described loss resistance.

The present inventors paid attention to the fact that one large opening provided on the side face of the conductive shield case for the purpose of taking out collectively a plurality of external connection terminals to the outside of the conductive shield case produces nonuniform eddy currents on the conductive shield case and increases the loss resistance of the winding (drive coil). In accordance with the present invention, the opening of the conductive shield case for taking out external connection terminals is so arranged and configured as not to affect the paths of eddy currents produced on the conductive shield case.

BRIEF DESCRIPTION OF THE DRAWINGS

The present invention will become apparent from the following detailed description made in conjunction with the accompanying drawings in which:

FIGS. 17 and 18 are oblique views of still another embodiment according to the invention.

DESCRIPTION OF THE PREFERRED EMBODIMENTS

The present invention will now be described by referring to embodiments.

Figure 1:
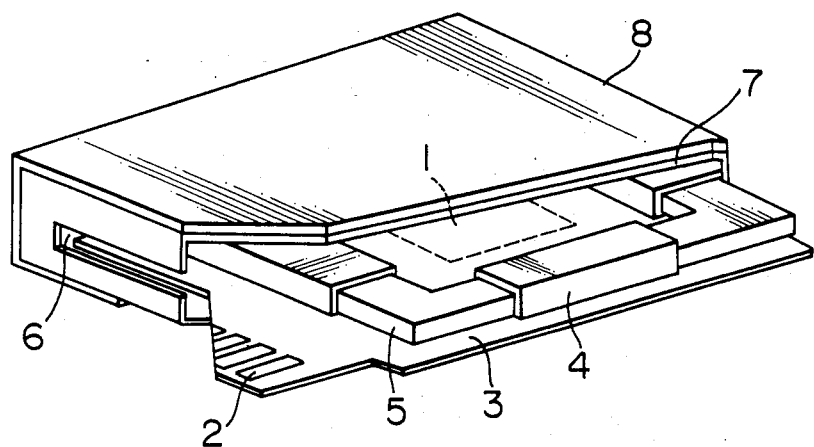
FIG. 1 is an oblique view of a partially broken magnetic bubble memory module.
Figure 2:
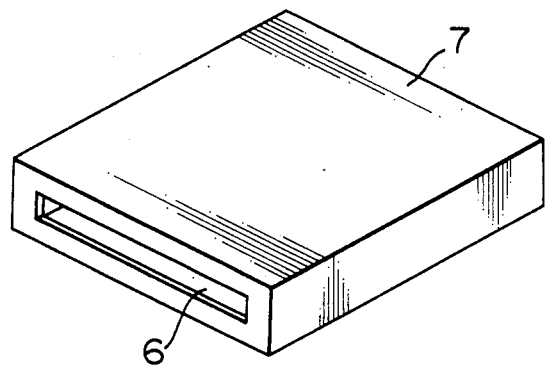
FIG. 2 is an oblique view of a conductive shield case.
Figure 3:
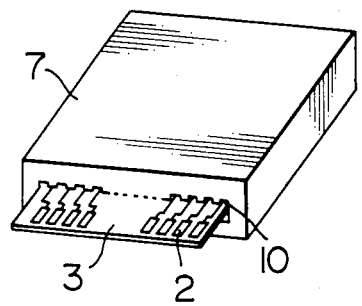
FIG. 3 is an oblique view of an embodiment of a conductive shield case housing a printed circuit board according to the present invention.
Figure 4:
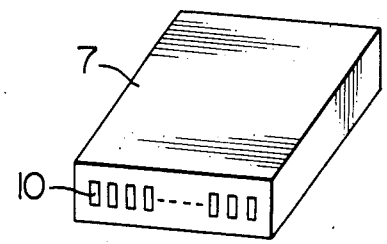
FIG. 4 is an oblique exterior view of the conductive shield case according to the present invention.

FIG. 3 is an oblique view of a conductive shield case 7 housing a printed circuit board 3 according to the present invention. FIG. 4 is an oblique exterior view of the constructed conductive shield case 7. In this embodiment, small openings 10 as many as external connection terminals 2 are arranged on the side face of the conductive shield case 7 at predetermined intervals. Leads for the external connection terminals 2 are taken out separately through respective openings 10.

Figure 5:
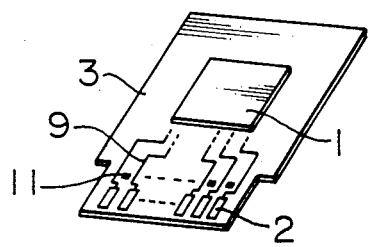
FIG. 5 is an oblique view of a printed circuit board to be housed in the conductive shield case according to the present invention.

The conductive shield case 7 housing the printed circuit board 3 is constructed as follows. FIG. 5 shows a printed circuit board 3 having a magnetic bubble memory chip 1, magnetic cores which are not illustrated and have windings wound around it, and leads 9 destined to external connection terminals 2 imprinted thereon. In this case, openings 11 are provided between leads immediately before the external connection terminals 2 in order to separate individual leads 9.

Figure 6:
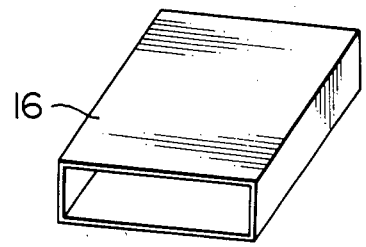
FIGS. 6, 7 and 8 are oblique views of components of the conductive shield case according to the present invention.
Figure 7:
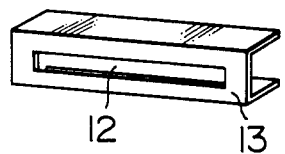
Figure 8:
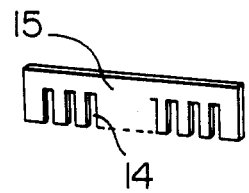

FIGS. 6, 7 and 8 illustrate components of the conductive shield case 7 having openings on the side face thereof as illustrated in FIG. 4. FIG. 6 shows a main body 16 of the conductive shield case. FIG. 7 shows a conductive front cap 13 having a large opening 12. FIG. 8 shows a conductive comb plate 15 having comb teeth. In this embodiment, the comb teeth 14 of the conductive comb plate 15 as illustrated in FIG. 8 are inserted into the openings 11 arranged on the printed circuit board 3 as illustrated in FIG. 5. In addition, the conductive front cover 13 having a large opening 12 as illustrated in FIG. 7 is put on the conductive comb plate 15 from the side of the external connection terminals 2 in order to form openings arranged on the conductive shield case. The printed circuit board 3 having components thus constructed thereon is inserted into the main body 16 of the conductive shield case so that the external connection terminals 2 will appear on the front face. Finally, the conductive shield case 16 is electrically connected to the conductive front cap 13 and the conductive comb plate 15 to form the conductive shield case housing the printed circuit board of the present invention.

Figure 14:
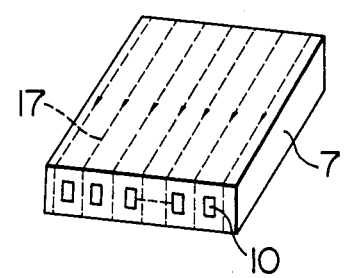

In this embodiment, the distribution of eddy currents becomes uniform as represented by eddy currents 17 of FIG. 14. Accordingly, the loss resistance can be decreased. In addition, it becomes possible to enhance the uniformity of the magnetic field and the intensity of the magnetic field.

Figure 9:
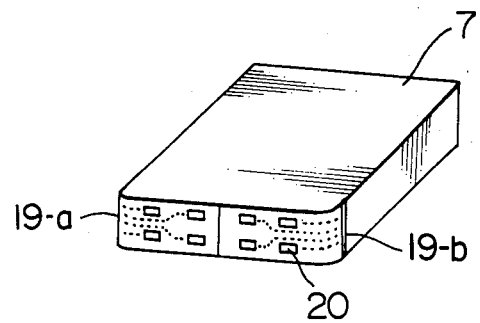
FIG. 9 is an oblique view of another embodiment of a conductive shield case housing a printed circuit board according to the present invention.
Figure 10:
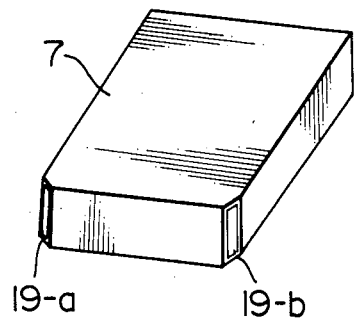
FIGS. 10 and 11 are oblique views of components of the conductive shield case according to the present invention illustrated in FIG. 9.
Figure 11:
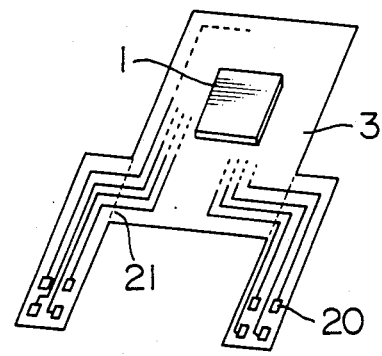

FIG. 9 is an oblique view of another embodiment of a conductive shield case according to the present invention. The structure of the conductive shield case 7 is illustrated in FIG. 10. By using a flexible printed circuit (FPC) to be described later, external connection terminals 20 are taken out through corner openings (19a, 19b). FIG. 11 shows a printed circuit board 3 having a magnetic bubble memory chip 1 and the external connection terminals 20 made of the FPC circuit. The printed circuit board 3 is bent at lines 21 to pass the external connection terminals 20 through the corner openings (19a, 19b) of the coductive shield case 7 to the outside thereof with the two external portions of the circuit board 3 being bent over along the front side of the shield case as shown in FIG.9.

Figure 15:
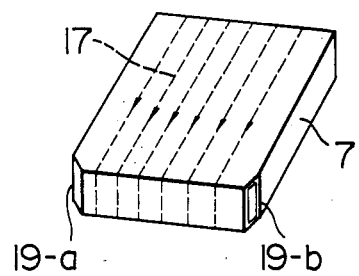

In this embodiment, the distribution of eddy currents becomes uniform as represented by eddy currents 17 of FIG. 15. Therefore, the conductive sectional area is increased, the loss resistance being largely decreased.

Figure 12:
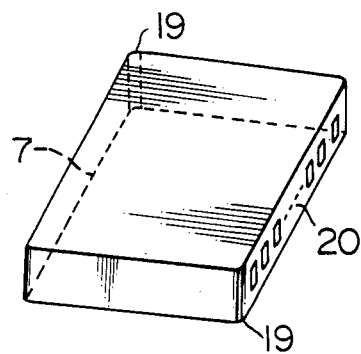
FIG. 12 is an oblique view of still another embodiment of a conductive shield case housing a printed circuit board according to the present invention.
Figure 13A:
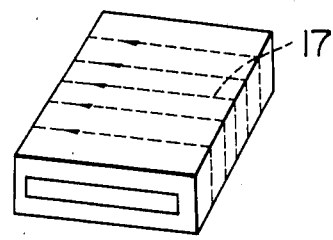
FIGS. 13a, 13b, 14 and 15 illustrate distribution of eddy currents flowing in conductive shield cases.
Figure 13B:
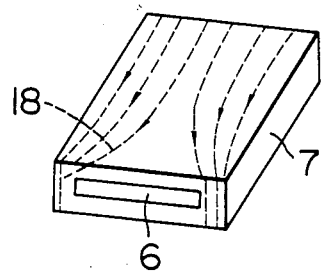

FIG. 12 shows still another embodiment of the present invention. In FIG. 12, openings 19 are located at diagonal corners of the conductive shield case 7 and the portion of the circuit board having the external connection terminals thereon extends through an opening 19 and is bent along a side of the shield case 7. Although in this embodiment the number of corner openings 19 is two, it may be one, three or more. Further, the shape of the conductive shield case 7 is not restricted to a square but may be circular.

Figure 16:
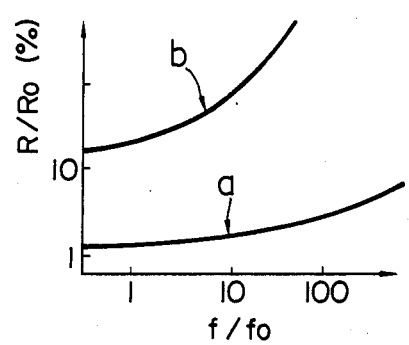
FIG. 16 illustrates curves representing the frequency characteristics of the loss resistance when the conductive shield case and the conductive shield case of the present invention are used.

FIG. 16 shows frequency characteristics of the winding loss resistance values b and a of the intermediate magnetic bubble memory units and the present invention, respectively. In the characteristic a of the present invention, the loss resistance can be reduced to nearly one tenth as compared with that of the intermediate unit.

FIGS. 17 and 18 shows another embodiment using a flat or ribbon cable 22 consisting of a plurality of wires lying side-by-side in a plane for connection means between the printed circuit board 3 and an external unit. The flat cable 22 connected to the circuit board 3 through a connector or by direct soldering thereto and are ripped open into a desired number of bundles 23 by a short length along the cable. Each of the bundles 23 are inserted into the teeth of the comb 15. The comb 15 may be supported by the conductive front cover 13 having an opening for passing the ribbon cable. The eddy current will flow through the comb teeth or the front cover to surround the case 24 as indicated by broken lines as shown in FIG. 18. In the above embodiments, the shield case 7 will be preferably connected to the ground of the circuit board 3.

As evident from the foregoing description, in according with the present invention, it is possible in the magnetic bubble memory unit to obtain the uniform distribution of eddy currents flowing in the conductive shield case used for confining the rotating magnetic field thereto. As a result, the loss of the winding (drive coil) in the magnetic bubble memory unit can be largely reduced.

The rotating magnetic field may be provided by the two cross windings in the directions x and y surrounding the circuit board, instead of the cores 5 and the windings 4, as in the magnetic bubble module described in the Japanese Patent Kokai No. 16435/82. In this case, an enlarged shield case is used for enclosing the printed circuit board.

What is claimed is:

1. A magnetic bubble memory unit comprising:
   windings confronting in parallel each other;
   a printed circuit board having a magnetic bubble memory chip mounted thereon, said magnetic bubble memory chip being located within the space formed by said windings; and
   a conductive shield case for covering both said magnetic bubble memory chip and said windings on said printed circuit board;
   said conductive shield case having a conductive side plate provided with slitlike openings for passing external connection means extending from said printed circuit board to the outside of said conductive shield case.

2. A magnetic bubble memory unit according to claim 1, wherein said conductive shield case has a shape of a rectangular box and said slitlike openings are provided at a side of said conductive shield case.

3. A magnetic bubble memory unit according to claim 1, wherein said slitlike openings are provided in a plane of said conductive side plate.

4. A magnetic bubble memory unit according to claim 1, wherein said external connection means a flat cable of a plurality of insulated electric wires shared in a plurality of bundles extending from said printed circuit board through said slitlike openings.

5. A magnetic bubble memory unit according to claim 1, wherein said external connection means is a part of a flexible printed circuit board extending from said conductive shield case.

6. A magnetic bubble memory unit according to claim 1, further comprising magnetic cores having said windings wound thereon.

7. A magnetic bubble memory unit comprising:
   two pairs of windings confronting in parallel each other;
   a printed circuit board having a magnetic bubble memory chip mounted thereon, said magnetic bubble memory chip being located within the space formed by said windings;
   a conductive shield case for covering said magnetic bubble memory chip on said printed circuit board; and
   a conductive comb plate having comb teeth and electrically conductively coupled to said conductive shield case, said teeth forming paths for eddy currents caused by current through said windings; wherein space between said comb teeth forms slitlike openings for passing connection means therethrough extending to the outside.

8. A magnetic bubble memory unit according to claim 7, wherein said conductive shield case has a shape of a rectangular box and said slitlike openings are provided at a side of said conductive shield case.

9. A magnetic bubble memory unit according to claim 7, wherein said slitlike openings are provided in a plane of said side plate.

10. A magnetic bubble memory unit according to claim 7, wherein said external connection means includes a flat cable of a plurality of insulated electric wires shared in a plurality of bundles extending from said printed circuit board through said slitlike openings.

11. A magnetic bubble memory unit according to claim 7, wherein said connection means is a part of a flexible printed circuit board extending from said conductive shield case.

12. A magnetic bubble memory unit according to claim 7, further comprising a support member for supporting said conductive comb plate from outside of said conductive shield case, said support member having a slitlike opening at a position in conformity with said slitlike openings of said conductive comb plate to pass said connection means therethrough.

13. A magnetic bubble memory unit according to claim 7, further comprising a magnetic core having said windings wound thereon.

14. A magnetic bubble memory unit comprising:
    two pairs of windings confronting in parallel each other;
    a magnetic core having said windings wound thereon;
    a printed circuit board having a magnetic bubble memory chip mounted thereon, said magnetic bubble memory chip being located within the space formed by said windings; and
    a conductive shield case for covering said magnetic bubble memory chip on said printed circuit board, said windings and said magnetic core, said conductive shield case enabling eddy current flow therethrough;
    said conductive shield case having a shape of a rectangular box and at least one slitlike opening provided at at least one corner of said conductive shield case for passing therethrough external connection means extending from said printed circuit board to the outside of said conductive shield case so as to enable a uniform distribution of the eddy current flow through said conductive shield case.

15. A magnetic bubble memory unit according to claim 14, wherein said external connection means includes a flat cable of a plurality of insulated electric wires shared in a plurality of bundles extending from said printed circuit board through said at least one slitlike opening.

16. A magnetic bubble memory unit according to claim 14, wherein said printed circuit board is a flexible printed circuit board and said external connection means is a part of said flexible printed circuit board extending through said at least one slitlike opening from said conductive shield case.

17. A magnetic bubble memory unit according to claim 16, wherein said external combustion means forming a part of said flexible printed circuit board extends through said at least one slitlike opening and is bent onto a surface of a side of said conductive shield case.

18. A magnetic memory bubble unit according to claim 16, wherein said conductive shield case is provided with at least one slitlike opening at at least two corners of said conductive shield case.

19. A magnetic bubble memory unit according to claim 18, wherein said flexible printed circuit board includes at least two external connection means, a respective one of said external connection means extending through said at least one slitlike opening at a respective corner of said conductive shield case.

20. A magnetic bubble memory unit according to claim 19, wherein said at least two external connection means extending outside of said conductive shield case at a respective corner are bent onto a surface of a side of said conductive shield case.

* * * * *